(12) United States Patent
Wang et al.

(10) Patent No.: US 7,555,734 B1
(45) Date of Patent: Jun. 30, 2009

(54) PROCESSING CONSTRAINTS IN COMPUTER-AIDED DESIGN FOR INTEGRATED CIRCUITS

(75) Inventors: Qiang Wang, Campbell, CA (US);
Rajat Aggarwal, Sunnyvale, CA (US);
Jason H. Anderson, Toronto (CA)

(73) Assignee: Xilinx, Inc., San Jose, CA (US)

( * ) Notice: Subject to any disclaimer, the term of this patent is extended or adjusted under 35 U.S.C. 154(b) by 139 days.

(21) Appl. No.: 11/810,442

(22) Filed: Jun. 5, 2007

(51) Int. Cl.
*G06F 17/50* (2006.01)
*G06F 9/45* (2006.01)

(52) U.S. Cl. .................. 716/1; 716/4; 716/7; 716/9
(58) Field of Classification Search .............. None
See application file for complete search history.

(56) References Cited

U.S. PATENT DOCUMENTS

| | | | |
|---|---|---|---|
| 6,983,439 B1 | 1/2006 | Saunders et al. | |
| 7,024,636 B2 * | 4/2006 | Weed | 716/1 |
| 7,111,262 B1 * | 9/2006 | Singh | 716/7 |
| 7,415,682 B2 * | 8/2008 | Padalia et al. | 716/2 |
| 2007/0245281 A1 * | 10/2007 | Riepe et al. | 716/9 |

* cited by examiner

*Primary Examiner*—Leigh Marie Garbowski
(74) *Attorney, Agent, or Firm*—Kevin Cuenot; Lois D. Cartier

(57) ABSTRACT

A computer-implemented method of performing a Computer-Aided Design (CAD) flow on a circuit design for a programmable logic device (PLD) can include inserting a preprocessing task into the CAD flow prior to a selected task that does not recognize a constraint, wherein the preprocessing task introduces a modification into the circuit design according to the constraint. The circuit design including the modification can be processed through the selected task of the CAD flow. A reversal task can also be inserted into the CAD flow, wherein the reversal task removes the modification introduced into the circuit design by the preprocessing task. The method further can include processing the circuit design through at least one other task of the CAD flow and outputting the processed circuit design.

20 Claims, 5 Drawing Sheets

PROCESSING CONSTRAINTS IN COMPUTER-AIDED DESIGN FOR INTEGRATED CIRCUITS

FIELD OF THE INVENTION

The invention relates to integrated circuit devices (ICs). More particularly, the invention relates to processing constraints in a Computer-Aided Design (CAD) flow for implementing circuit designs within ICs.

BACKGROUND

Programmable logic devices (PLDs) are a well-known type of integrated circuit that can be programmed to perform specified logic functions. One type of PLD, the field programmable gate array (FPGA), typically includes an array of programmable tiles. Each programmable tile can include both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Although PLDs offer significant flexibility for implementing a wide range of application designs, there are constraints that must be followed when implementing a circuit design within a PLD. A "constraint" typically refers to a rule, or a set of rules, that specifies physical restrictions relating to the usage of programmable logic and/or programmable interconnect of a given PLD. These constraints dictate how the programmable logic and the programmable interconnect of the PLD may be used and/or configured when implementing a circuit design.

Software-based implementation tools, often referred to as Computer-Aided Design (CAD) tools, Electronic Design Automation (EDA) tools, or the like, follow these constraints when implementing a circuit design within a PLD. The implementation tools determine how the programmable logic and the programmable interconnect will be allocated and configured to implement the circuit design, while still observing the constraints.

The complexity of modern circuit designs and PLDs has led to the development of a multi-stage technique for implementing circuit designs within PLDs. In general, implementation tools have been built as a flow of multiple tasks, where each task is responsible for a specific portion of the overall implementation flow. For example, an implementation flow, sometimes referred to as a "CAD flow," can include tasks such as synthesis, translation, packing, placement, and routing. Each of these tasks can be subdivided into further tasks, or sub-tasks. In this regard, a task such as placement can be broken down into a plurality of tasks and, therefore, can also be considered a CAD flow.

PLDs with new or enhanced architectures continually become available that can accommodate increasingly complex circuit designs. The constraints that must be followed when implementing a circuit design within a PLD change with the PLD architecture. That is, as the physical architecture of the PLD changes from one generation to the next, the constraints that must be observed also change. The implementation tools must be capable of following, or "handling," these new constraints. Often, one or more tasks of the implementation flow cannot handle a new constraint and cannot easily be modified to do so.

SUMMARY

The present invention relates to integrated circuit devices (ICs). More particularly, the invention relates to handling constraints relating to physical requirements of ICs when implementing circuit designs using Computer-Aided Design (CAD) techniques. One embodiment of the present invention can include a computer-implemented method of performing a CAD flow on a circuit design for a programmable logic device (PLD). The method can include inserting a preprocessing task into the CAD flow prior to a selected task that does not recognize, e.g., handle, a constraint. The preprocessing task can introduce a modification into the circuit design according to the constraint. The method further can include processing the circuit design including the modification through the selected task of the CAD flow. A reversal task can also be inserted into the CAD flow. The reversal task can remove the modification introduced into the circuit design by the preprocessing task. The circuit design can be processed through at least one other task of the CAD flow. The processed circuit design can be output.

The method can include defining the constraint to limit the flip-flop elements in a slice of the PLD to include only flip-flop elements having a same signature. A signature of a flip-flop element can be defined to specify, for a selected flip-flop element, a clock signal that drives the selected flip-flop element and a control mode for the selected flip-flop element.

The preprocessing task can include clustering flip-flop elements of the circuit design forming a plurality of clusters of flip-flop elements, wherein each cluster includes a number of flip-flop elements that does not exceed a number of flip-flops within a slice of the PLD. Clustering flip-flop elements also can include including within each cluster only flip-flop elements driven by a same clock signal and having a same control mode.

The method also can include selecting the CAD flow to be a placer CAD flow that assigns elements of the circuit design to locations on the PLD, wherein the circuit design that is output is a placed circuit design. The selected task can be selected to be an AP-Spread task. The at least one other task of the CAD flow can be selected to be an AP-Fitter task.

Another embodiment of the present invention can include a computer-implemented method of performing a placer CAD flow on a circuit design for a PLD. The method can include distributing circuit elements of the circuit design to locations throughout the PLD. The circuit elements can include flip-flop elements. A preprocessing task can be inserted into the placer CAD flow. The preprocessing task can include determining a signature for each flip-flop element of the circuit design, forming clusters of flip-flop elements having a same signature, and assigning circuit elements to sites on the PLD, wherein each cluster is processed as a single entity.

A de-clustering task can be inserted into the CAD flow, wherein the de-clustering task de-clusters the circuit design. At least one additional task of the placer CAD flow can be performed on the circuit design. A placed circuit design can be output.

Forming clusters can include creating a cluster for each flip-flop element, wherein each cluster, at least initially, comprises a single flip-flop element. Forming clusters also can include identifying at least one pair of clusters according to merge criteria, forming a merged cluster from each pair of clusters, and assigning a location on the PLD to each merged cluster. Forming clusters further can include, until no further pairs of clusters are identified to be merged, iteratively identifying at least one pair of clusters, forming a merged cluster from each pair of clusters, and selecting a location for each merged cluster.

The de-clustering task can include, for each merged cluster, separating the merged cluster into constituent clusters. The de-clustering task also can include iteratively separating each merged cluster into constituent clusters until no merged clusters remain.

Yet another embodiment of the present invention can include a computer program product including a computer-usable medium having computer-usable program code that, when executed by an information processing system, causes the information processing system to perform the various steps and/or functions disclosed herein.

DETAILED DESCRIPTION OF THE DRAWINGS

Figure 1:
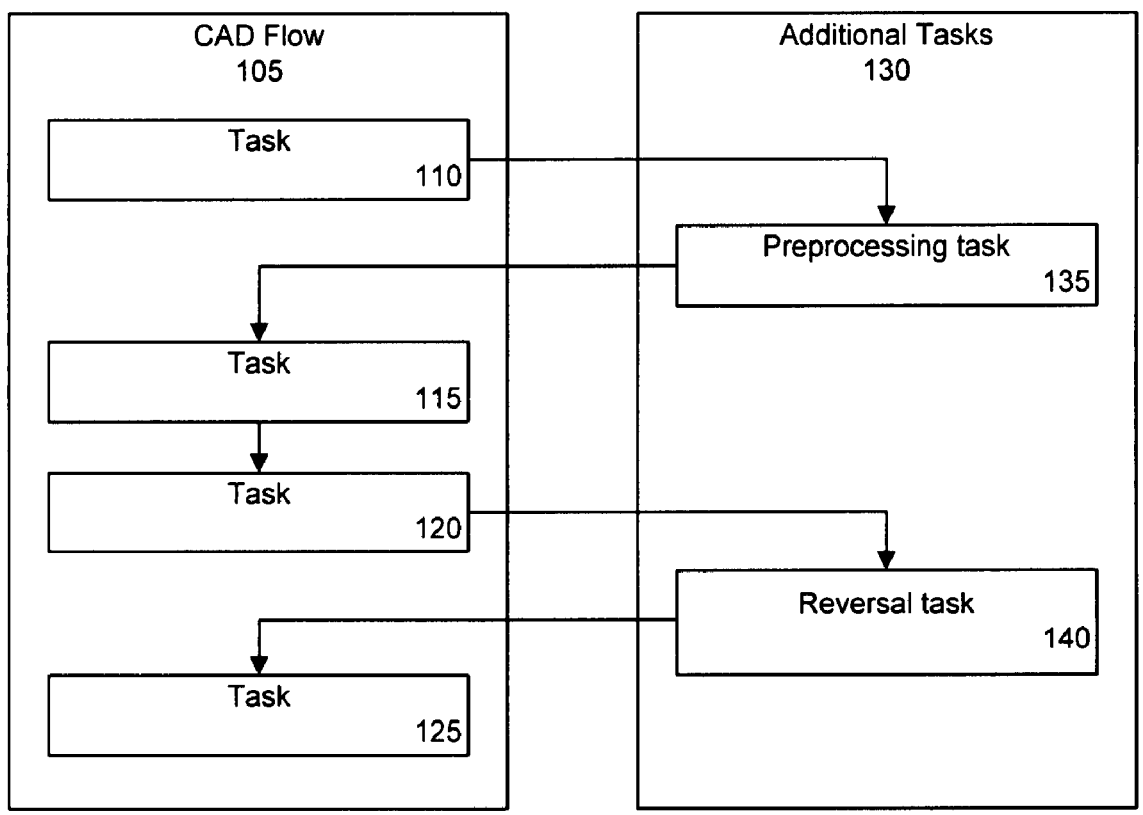
FIG. 1 is a diagram illustrating the augmentation of an existing Computer-Aided Design (CAD) flow in accordance with one embodiment of the present invention.

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention.

The present invention relates to handling constraints within a Computer-Aided Design (CAD) flow for implementing a circuit design within a programmable logic device (PLD). An existing CAD flow can include one or more tasks that are unable to process a constraint. A "constraint," as used herein, refers to a rule, or a set of rules, that specifies physical restrictions relating to the usage of the programmable logic and/or the programmable interconnect of a given PLD. In accordance with the embodiments disclosed herein, the existing CAD flow can be augmented with a preprocessing task. The preprocessing task can modify the circuit design in a manner that is consistent with the constraint. The modified circuit design can be output and provided to a next task of the CAD flow.

The existing CAD flow tasks that operate upon the manipulated circuit design need not be modified. Processing required to accommodate the constraint can be performed by the preprocessing task. One or more of the CAD flow tasks that are unable to handle, or consider, the constraints can execute upon the modified circuit design. The modifications introduced by the preprocessing task allow the tasks of the CAD flow that are unable to handle the constraint to process the circuit design in a manner that does not violate the constraint. Once such tasks finish, the modifications introduced into the circuit design by the preprocessing task can be removed from the circuit design. That is, an additional task can be introduced into the existing CAD flow which removes any processing and/or modifications added to the circuit design via the preprocessing task.

Accordingly, subsequent tasks of the existing CAD flow can operate upon the circuit design in a manner that is unrestricted by the modifications introduced into the circuit design by the pre-processing task. By introducing modifications through a preprocessing task and later reversing those modifications, an existing CAD flow can be used with "next" generation PLDs that may have a different architecture and, thus, different constraints, than the existing CAD flow was designed to handle. The existing CAD flow can be modified only in the sense that steps are added. Existing tasks of the CAD flow, however, need not be modified.

FIG. 1 is a diagram illustrating the augmentation of an existing CAD flow 105 in accordance with one embodiment of the present invention. The CAD flow 105 can include a plurality of different tasks such as tasks 110, 115, 120, and 125. The CAD flow 105 can be augmented through the insertion of one or more additional tasks 130. As shown, the additional tasks 130 can include a preprocessing task 135 as well as a reversal task 140 that reverses, or removes, modifications introduced by the preprocessing task 135.

In one embodiment, the CAD flow 105 can be a series of tasks that, taken collectively, implements a circuit design within a PLD. For example, the CAD flow 105 can process a circuit design and output a bitstream that, when loaded into a PLD, configures the PLD to implement the circuit design. In that case, the CAD flow 105 can be viewed at a level where the constituent tasks can include, but are not limited to, synthesis, translation, packing, placement, and routing. In another illustration, a CAD flow can be viewed from a lower, more detailed level. For example, a particular stage of circuit design implementation, such as placement, can be viewed as the CAD flow 105 which includes tasks 110-125.

After execution of task 110, a preprocessing task 135 can be performed that is not part of the original CAD flow 105. The preprocessing task 135 can be inserted to handle or process the circuit design in accordance with a constraint. The preprocessing task 135 can be inserted into the CAD flow 105 at an intermediate point prior to one or more tasks that do not support or handle the constraint, e.g., tasks 115 and 120.

Within CAD flow 105, task 125 can be one that is able to handle or account for the constraint. As such, an additional task can be inserted into the CAD flow at a point just prior to task 125. The inserted task can be the reversal task 140 that reverses the effects of the preprocessing task 135. After execution of the reversal task 140, the circuit design can be output to task 125. Task 125 can be executed in a manner that is unrestricted with respect to any modifications implemented by the preprocessing task 135.

Insertion of the preprocessing task 135 and the reversal task 140, which removes modifications introduced into the circuit design by the preprocessing task 135, allows an existing CAD flow to be used for processing circuit designs for PLDs with constraints that did not exist when the CAD flow was programmed or otherwise developed.

Figure 2:
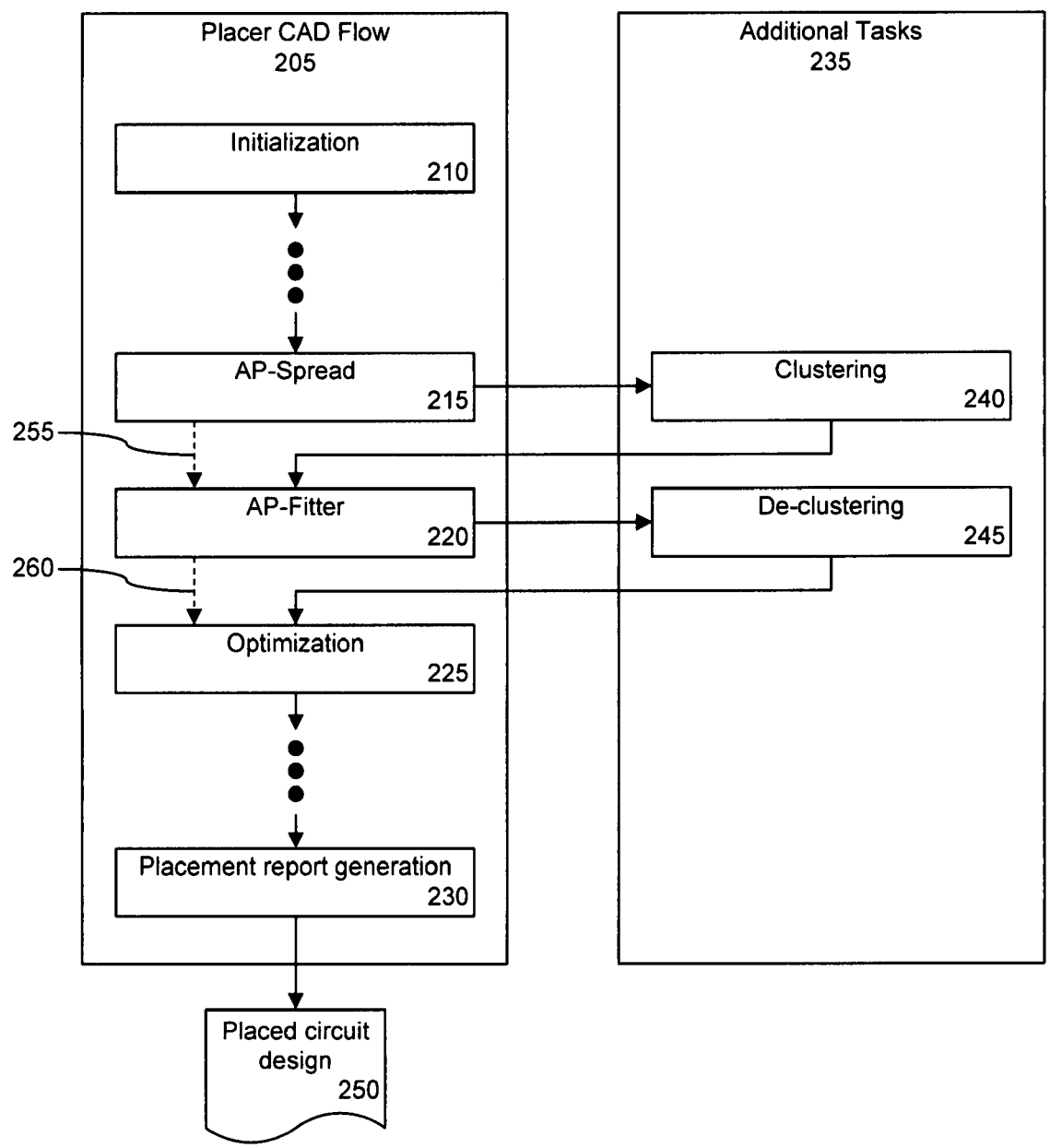
FIG. 2 is a diagram illustrating the augmentation of an existing placer CAD flow in accordance with another embodiment of the present invention.

FIG. 2 is a diagram illustrating the augmentation of an existing CAD flow in accordance with another embodiment of the present invention. The pictured embodiment can be for a placer CAD flow 205 that assigns elements of a circuit design to sites, or locations, of a PLD in which the circuit design is to be implemented (the "target PLD"). The tasks of the placer CAD flow 205 can include, but are not limited to, initialization 210, AP-Spread 215, AP-Fitter 220, optimization 225, and placement report generation 230.

From time to time throughout this disclosure, a placement process for implementing a circuit design within a PLD is used as an example of a CAD flow. The embodiments disclosed herein, however, are not intended to be limited to one particular type of CAD flow. Rather, it should be appreciated by the skilled artisan that the embodiments described herein can be applied to any of a variety of different CAD flows that include a plurality of tasks, where the CAD flow is to be extended to accommodate various constraints not contemplated at the time the CAD flow was implemented or developed.

After the initialization task 210, the AP-Spread task 215 can be performed. The AP-Spread task 215 of the placer CAD flow 205 can distribute elements of the circuit design throughout the target PLD. The AP-Spread task 215 can assign the elements to locations on the PLD according to connectivity among the elements. For example, elements that are connected to one another, as specified by the circuit design, can be assigned to locations on the PLD that are closer to one another. The AP-Spread task 215 can distribute elements to locations on the PLD in a mathematical fashion. The elements can be assigned to locations on the PLD, but not necessarily to sites of the PLD. The AP-Fitter task 220 can process elements that have been assigned to locations of the target PLD and adjust the assigned location of each circuit element to coincide with an available site of the target PLD.

Some types of PLDs impose a physical limitation regarding the placement of elements of the circuit design on the PLD. One example of such a constraint is that in some PLDs, each circuit element of a slice, e.g., a flip-flop, must use the same clock signal and the same control mode. As used herein, the "control mode" can refer to characteristics of the circuit element including, but not limited to, whether the circuit element is in a synchronous or asynchronous mode and/or the particular control signals provided to the circuit element. As known, some varieties of PLDs, for example, field programmable gate arrays (FPGAs), have programmable logic tiles called configurable logic blocks (CLBs). These CLBs can be further subdivided into one or more units of programmably configurable circuitry known as "slices." A plurality of slices may be disposed in each CLB, with one or more arrays of CLBs forming at least part of the programmably configurable circuitry of the FPGA.

Each slice, and therefore, each CLB, can include a predetermined number of flip-flops depending upon the architecture of the target PLD. For example, in some FPGAs, a CLB can include two slices, with each slice including four flip-flops. Such FPGAs can accommodate up to eight flip-flops per CLB. While a CLB including eight flip-flops is used for purposes of illustration, it should be appreciated that a CLB can include fewer or more flip-flops. As such, the embodiments disclosed herein are not intended to be limited solely to CLBs including eight flip-flops or to slices including four flip-flops.

As used herein, a "signature," can specify the particular clock signal used to drive a circuit element, e.g., a flip-flop, and the control mode of the circuit element. For example, a PLD can support or include multiple clock signals. Two flip-flops having the same signature are driven by the same clock signal. The control mode of a flip-flop can specify, for example, whether the circuit element is asynchronous or synchronous. Two flip-flops having the same signature also can be said to have the same control mode, e.g., both be configured as synchronous or asynchronous and have the same control signals.

The AP-Fitter task 220 can be an example of a task that cannot accommodate a particular design constraint such as the constraint in which each flip-flop that is assigned to a same slice must have a same signature. For example, since the AP-Fitter task 220 is analytical in nature, modifying the AP-Fitter task 220 to handle the flip-flop constraint would be time consuming and complex. In lieu of such updating or modification of the AP-Fitter task 220, a clustering task 240 can be inserted into the placer CAD flow 205 after execution of the AP-Spread task 215 and prior to the AP-Fitter task 220.

The clustering task 240 can process the circuit design to create clusters of flip-flop elements (e.g., flip-flop circuit elements of the circuit design to be assigned to flip-flops or flip-flop sites of the target PLD) that have a same signature. The clusters can be defined within the circuit design before the circuit design is passed to the AP-Fitter task 220. The AP-Fitter task 220 can operate on the modified circuit design by treating each cluster of one or more flip-flop elements as a single entity. Though the AP-Fitter task 220 is not configured to handle the flip-flop constraint, the AP-Fitter task 220, without modification, can process the circuit design in accordance with the constraint. The clustering task allows the AP-Fitter task 220 to execute with each cluster being treated as a single entity or circuit element to be placed.

A de-clustering task 245 can be inserted into the placer CAD flow 205. The de-clustering task 245 can be inserted into the placer CAD flow at an intermediate point following the execution of the AP-Fitter 220, but prior to placement report task 230. The de-clustering task 245 can remove the clustering information, e.g., clusters, added to the circuit design through the operation of the clustering task 240. After the de-clustering task 245, flip-flop elements are not associated with any other flip-flop elements, thereby allowing the optimization task 225 to operate without being bounded by the clusters.

With the de-clustering task 245 having removed the clusters from the circuit design, the optimization task 225 can operate in a manner that is not restricted by the clusters. The optimization task 225 can operate upon elements of the circuit design on an individual basis. As such, the optimization task 225 can be updated to include a "check" that ensures that any optimization, e.g., move or swap of circuit elements, conforms to existing constraints. Thus, the optimization task 225 can be updated to include a check that any movement of a flip-flop element occurs only if each flip-flop element that will be located within the slice after the move has a same signature.

Without the insertion of the clustering task 240 and the de-clustering task 245, the AP-Spread task 215 would continue directly to the AP-Fitter task 220, as indicated by arrow 255. Similarly, the AP-Fitter task 220 would continue directly to the optimization task 225 as indicated by arrow 260.

The placement report task 230 can generate a report indicating the status of the different circuit elements of the circuit design. The placement report can specify information including, but not limited to, whether each element of the circuit design was successfully placed on the target PLD, which circuit elements were not successfully placed, and/or which constraints were violated by the resulting placement solution. The placer CAD flow 205 can output a placed circuit design 250. As used herein, "outputting" or "output" can mean, without limitation, writing to a file, writing to a user display or other output device, playing audible notifications or providing other physical feedback to a user, sending or transmitting to another system, exporting, or the like.

Figure 3:
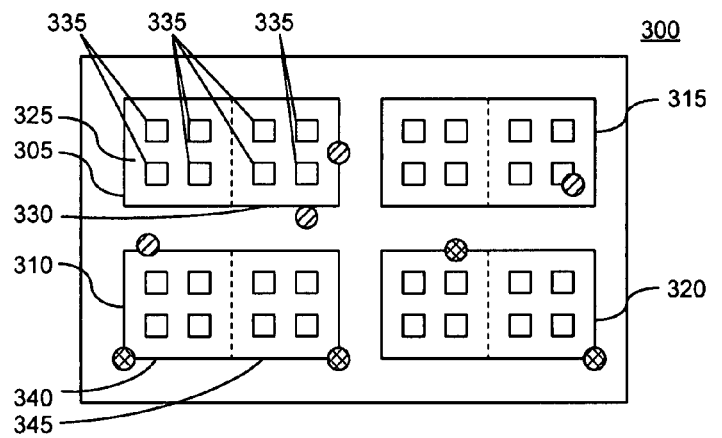
FIG. 3 is a block diagram illustrating one aspect of a placer CAD flow with respect to a Programmable Logic Device (PLD) which is useful for understanding the embodiments disclosed herein.

FIG. 3 is a block diagram illustrating one aspect of a placer CAD flow with respect to a PLD 300 which is useful for understanding the embodiments disclosed herein. As shown, the PLD 300 can include a plurality of CLBs 305, 310, 315, and 320. Each CLB can be subdivided into two slices. For example, CLB 305 includes slices 325 and 330. CLB 310 includes slices 340 and 345, etc. Each slice can include four available flip-flops 335.

The circles dispersed throughout the PLD 300 represent elements of a circuit design, in this case flip-flop elements, to be assigned to flip-flops (sites) 335 on the target PLD. The flip-flop elements are distributed through the execution of the AP-Spread task of a placer CAD flow. Each pattern used to fill the circles, as indicated by the legend, indicates a flip-flop element having a distinct signature. The elements are distributed according to the connectivity among the elements as specified by the circuit design. As shown in FIG. 3, the flip-flop elements are assigned to locations on the target PLD 300. Though the AP-Spread task can distribute elements mathematically throughout the target PLD 300 in accordance with connectivity and availability of logic resources on the target PLD 300, the flip-flop elements are not necessarily assigned to locations on the target PLD 300 that correspond to actual flip-flops 335 within the slices.

Figure 4:
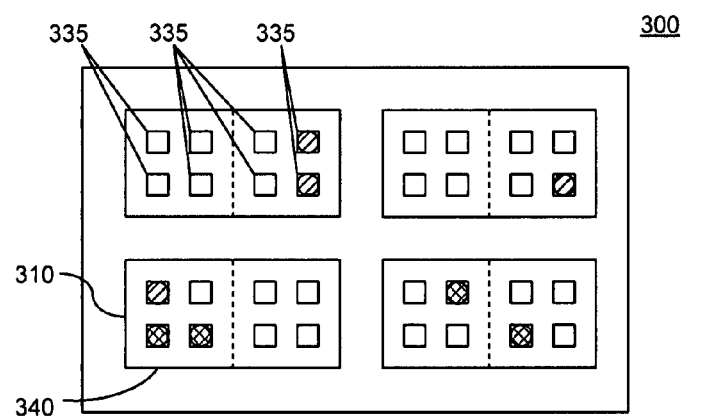
FIG. 4 is a block diagram illustrating another aspect of a placer CAD flow with respect to a PLD which is useful for understanding the embodiments disclosed herein.

FIG. 4 is a block diagram illustrating another aspect of a placer CAD flow with respect to the PLD 300 which is useful for understanding the embodiments disclosed herein. FIG. 4 represents the state of the PLD 300 after application of the AP-Fitter task where no clustering is performed. After the AP-Fitter task executes, each of the flip-flop elements has been relocated, or shifted, to an available flip-flop 335 within a slice. As noted, the task of fitting flip-flop elements into sites of slices is not easily updated to accommodate the flip-flop constraints. Accordingly, the placer flow may generate a placement of flip-flop elements to slices that violates the flip-flop constraints that the AP-Fitter task is unable to handle. For example, slice 340 of CLB 310 includes flip-flop elements of two different signatures, which violates the flip-flop constraint.

Figure 5:
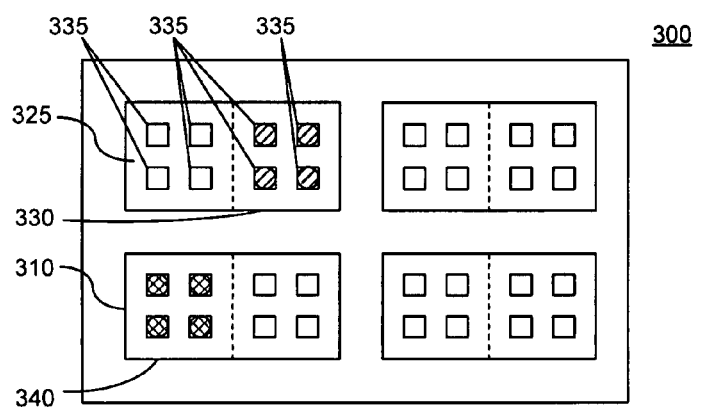
FIG. 5 is a block diagram illustrating yet another aspect of a placer CAD flow with respect to a PLD in accordance with another embodiment of the present invention.

FIG. 5 is a block diagram illustrating an aspect of a placer CAD flow with respect to the PLD 300 in accordance with another embodiment of the present invention. More particularly, the PLD 300 of FIG. 5 illustrates a placement that can be achieved when a clustering task is inserted between the AP-Spread task and the AP-Fitter task. As shown, one consequence of inserting the clustering task between the AP-Spread task and the AP-Fitter task is that the assignment of flip-flop elements to slice 340 of CLB 310 does not violate the flip-flop constraint. Another consequence is that slices are more fully packed, e.g., slices 330 and 340, which utilizes fewer routing resources and can result in a faster, more efficient circuit implementation. Flip-flop elements of the same signature, in general, can be assigned to a same cluster. That cluster can be treated as a single entity or circuit element by the AP-Fitter task and assigned to a particular slice of the PLD. For example, slices 330 and 340 are fully packed in that the flip-flops 335 within each of the slices 330 and 340 are fully utilized.

Figure 6:
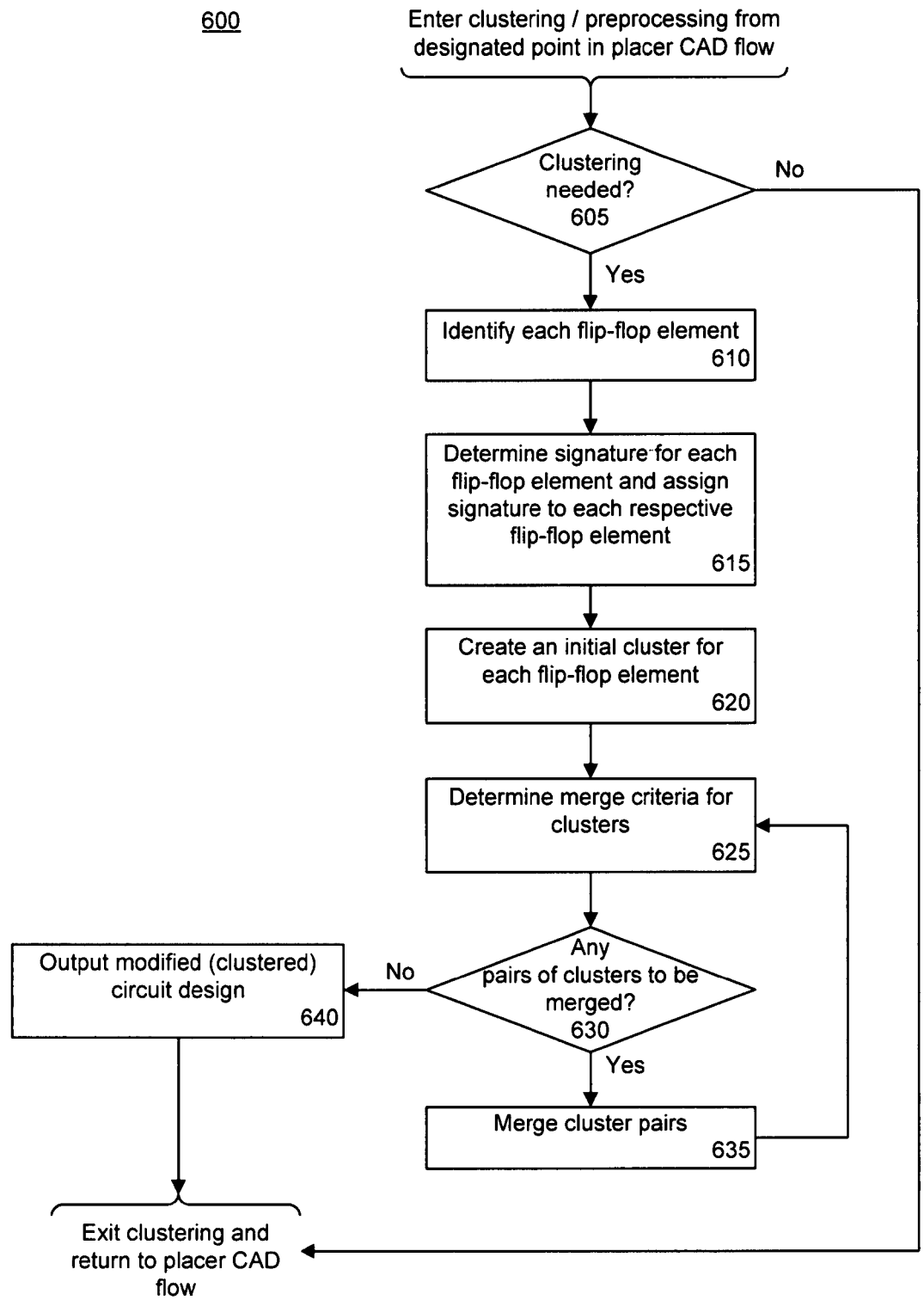
FIG. 6 is a flow chart illustrating a method of clustering a circuit design in accordance with another embodiment of the present invention.

FIG. 6 is a flow chart illustrating a method 600 of clustering a circuit design in accordance with another embodiment of the present invention. The method 600 can be performed by an EDA tool that has been configured to perform or execute a placer CAD flow. As noted, the clustering method 600 can be inserted into a placer CAD flow between an AP-Spread task and an AP-Fitter task. Accordingly, the method 600 can begin in step 605 where a determination can be made as to whether clustering is needed. For example, after execution of the AP-Spread task, the placer CAD flow can enter step 605.

In determining whether clustering is needed, the EDA tool performing a placer CAD flow can evaluate one or more parameters of the circuit design and/or the target PLD. In one embodiment, the density of flip-flops elements distributed throughout the target PLD can be evaluated. Density can be expressed in terms of the utilization of flip-flops of the target PLD by flip-flop elements of the circuit design. For example, a utilization of flip-flops of the target PLD above a predetermined percentage such as 70%, 75%, 80%, 85%, 90%, or 95% can cause the EDA tool to determine that clustering is needed. It should be appreciated by those skilled in the art that the particular usage percentages noted herein are provided for purposes of illustration only. Such usage thresholds, if desired, can be set lower than 70%, higher than 95%, or anywhere between. Further, the usage thresholds can be evaluated for particular sections of the target PLD as opposed to the entire PLD.

In another embodiment, the number of clock signals specified in the circuit design and/or the number of flip-flop control modes needed by the circuit design can be evaluated. It should be appreciated that the number of clock signals and the number of flip-flop control modes directly influences the number of signatures for flip-flops. Accordingly, either one or both of the parameters can be used to determine whether clustering is needed. For example, if the circuit design has more than a predetermined number of clock signals, the EDA tool can determine that clustering is needed. If the circuit design specifies more than a particular number of flip-flop control modes the EDA tool can determine that clustering is needed. In another embodiment, if the circuit design specifies a minimum number of clock signals and a minimum number of flip-flop control modes, the EDA tool can determine that clustering is needed, etc.

It further should be appreciated that some combination of flip-flop usage, clock signal count, and/or number of flip-flop control modes can be used to determine whether clustering is needed. For example, a cost function or other scoring function can be defined which depends upon one or more or all of the aforementioned factors. In any case, if the EDA tool determines that clustering is needed, the method can proceed to step 610. If not, the method can exit the clustering task and continue to the AP-Fitter task of the placer CAD flow.

In step 610, each flip-flop element of the circuit design to be assigned to a flip-flop in the target PLD can be identified. In step 615, a signature for each flip-flop element can be determined and assigned, or otherwise associated with that flip-flop element. As noted, a signature of a flip-flop element can specify the particular clock signal that drives that flip-flop element as well as the control mode for that flip-flop element. In one embodiment, each flip-flop element can be associated with an integer value that encodes the particular clock signal as well as the control mode for that flip-flop element, e.g., the signature. In step 620, each flip-flop element can be assigned to an initial cluster. In one embodiment, an initial cluster can be created for each flip-flop element identified in step 610. A list or other record of clusters of flip-flop elements can be created and maintained to track current or existing clusters and merged clusters.

In step 625, merge criteria can be determined for the clusters that exist. Particular merge criteria can be determined on a per-cluster basis, while other merge criteria can be determined with respect to pairs of clusters. For example, one merge criterion that can be used can be flip-flop density. As noted, flip-flop density refers to the usage of available flip-flops of the target PLD by flip-flop elements of the circuit design. The flip-flop density can be evaluated for one or more physical areas of the target PLD. Clusters can be associated with a measure of density, e.g., the density of the particular area of the target PLD in which the cluster is located.

Another merge criterion can be the potential change in wire length that would be attained through the merger of two clusters. The potential change in wire length is a merge criterion that can be determined for pairs of clusters. In one embodiment, for example, pairs of clusters, e.g., candidate pairs, can be generated by pairing those clusters that have flip-flops of the same signature. The potential change in wire length can be calculated for those pairs. The length of wire needed to connect flip-flop elements of the clusters being merged with other elements of the circuit design may or may not increase as a result of the merger.

To calculate the length of wire needed to connect flip-flop elements of the clusters being merged with other elements, a location at which the merged cluster will be located can be determined. In one embodiment, the location for the merged cluster can be determined based on an integrated cost function that considers the two locations at which the two original clusters to be merged are located, the total wire lengths of the connections from the merged cluster to other circuit components, and the densities of circuit components spread at different areas on the target PLD. In another embodiment, the merged cluster can be located at the location of either one of the original clusters being merged.

In any case, the overall change in wire length can be calculated and associated with each cluster the candidate pair. For example, a reduction in wire length can be favorable in terms of merging the two clusters. An increase in wire length can be less favorable. An increase in wire length, however, may not prevent the merger of two clusters, but rather be viewed in terms of the wire length increase with respect to other potential cluster mergers, e.g., be more favorable than another potential merger.

Another merge criterion can be the distance between two candidate clusters. The distance can be computed using an X-Y coordinate system overlaid upon the target PLD. The X component and the Y component of the distance between two candidate clusters can be added. In another embodiment, the distance can be computed as the hypotenuse of a right triangle formed from the location of each cluster of the candidate pair.

Another merge criterion can be a restriction on the number of flip-flop elements within a cluster. In one embodiment, a cluster can be limited to the number of flip-flop elements that can be placed into a slice, e.g., four. It should be appreciated that the upper bound on the number of flip-flop elements that can be included within each cluster is a function of the particular physical constraints of the target PLD that is being used. In this case, for example, a slice can include four flip-flop elements. If each circuit element in the slice is to have the same clock signal and control signal(s), then each flip-flop element in the CLB must have a same signature.

In step 630, the EDA tool can determine whether any of the clusters are to be merged and identify such cluster pairs. The EDA tool can evaluate the merge criteria to identify pairs of clusters to be merged. In one embodiment, a cost function can be used with can include one or more or all of the criteria discussed herein. For example, for a given pair, the density associated with each cluster of the candidate pair can be summed. If this value exceeds a minimum threshold, the candidate pair can be considered for merger. The total wire length, or increase in wire length, resulting from the merger of the cluster pair can be calculated to ensure that the wire length will not increase beyond a predetermined maximum or percentage. An additional check can be imposed to ensure that no merged cluster includes more than four flip-flop elements, e.g., the number of flip-flops included in a slice.

In step 635, any cluster pairs identified for merger in step 630 can be merged or combined into a single "merged" cluster. After step 635, the method can loop back to step 625 to update the merge criteria in light of the recent cluster merger(s). Any merged clusters can be treated the same as any other cluster. The list of clusters can be updated to reflect the new merged cluster(s) and the constituent cluster of each merged cluster. Still, the maximum number of flip-flop elements in a cluster cannot exceed four. The method can continue until no further cluster pairs are identified for merger. Accordingly, the method can proceed to step 640 where an updated circuit design can be output. The updated circuit design can specify a clustered circuit design.

Subsequent to the clustering task, the AP-Fitter task can assign or move the clustered flip-flop elements to slices of the target PLD. As noted, each cluster can be treated by the AP-Fitter task as a single entity. For example, a cluster of three flip-flop elements can be moved as a single flip-flop element. A cluster of four flip-flop elements can be moved as a single flip-flop element that requires, in this case, an entire slice for proper placement.

Figure 7:
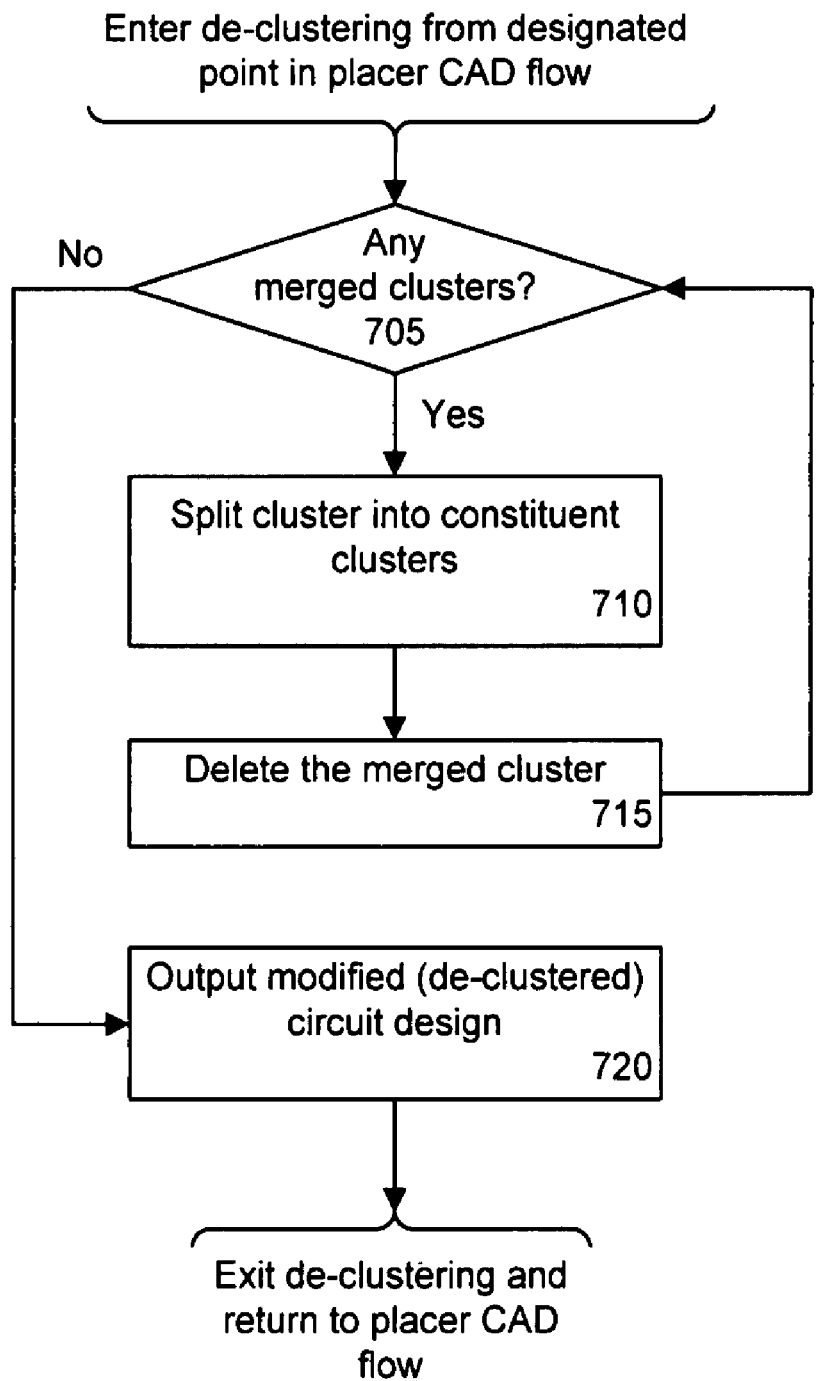
FIG. 7 is a flow chart illustrating a method of de-clustering a circuit design in accordance with another embodiment of the present invention.

FIG. 7 is a flow chart illustrating a method 700 of de-clustering a circuit design in accordance with another embodiment of the present invention. The method 700, like the method of FIG. 6, can be performed by an EDA tool. As noted, the de-clustering method 700 can be inserted into a placer CAD flow subsequent to the AP-Fitter task. In one embodiment, the de-clustering method can be inserted into the placer CAD flow immediately following the AP-Fitter task, e.g., prior to further optimizations.

Accordingly, the method 700 can begin in step 705 where the EDA tool can evaluate the circuit design to determine whether any merged clusters exist. Referring to FIG. 6, where each flip-flop element is initially placed into its own cluster, in step 705 the existence of merged clusters is evaluated. In this regard, the EDA tool can distinguish between the initial clusters including only a single flip-flop element and the merged clusters including more than one flip-flop element. For example, such information can be specified on the cluster list maintained in the EDA tool.

In step 710, after identifying a merged cluster, the merged cluster can be split into the two constituent clusters that were combined to form the merged cluster. In step 715, the merged cluster, now split, can be deleted from the circuit design. The merged cluster, for example, can be purged from the cluster list, leaving the constituent clusters indicated on the cluster list. After step 715, the method can loop back to step 705 where a determination can be made as to whether any further merged clusters remain to be processed.

In step 720, when no further merged clusters remain to be processed, the resulting circuit design can be output. The resulting circuit design is de-clustered as each cluster has been broken down to a cluster including a single flip-flop element. After step 720, one or more further tasks of the placer CAD flow can be performed if so desired. For example, one or more optimization steps can be performed. The optimization steps can be configured to account for the flip-flop constraints noted herein since the optimizations are applied on a circuit element by circuit element basis. The EDA tool performing the placer CAD flow can output a placed circuit design.

The flowcharts in the figures illustrate the architecture, functionality, and operation of possible implementations of systems, methods and computer program products according to various embodiments of the present invention. In this regard, each block in the flowcharts may represent a module, segment, or portion of code, which comprises one or more portions of computer-usable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and computer instructions.

The present invention can be realized in hardware, software, or a combination of hardware and software. The present invention can be realized in a centralized fashion in one computer system or in a distributed fashion where different elements are spread across several interconnected computer systems. Any kind of computer system or other apparatus adapted for carrying out the methods described herein is suited. A typical combination of hardware and software can be a general-purpose computer system with a computer program that, when being loaded and executed, controls the computer system such that it carries out the methods described herein.

The present invention also can be embedded in a computer program product, which comprises all the features enabling the implementation of the methods described herein. The computer program product can include a computer-usable or computer-readable medium having computer-usable program code which, when loaded in a computer system, causes the computer system to perform the functions described herein. Examples of computer-usable or computer-readable media can include, but are not limited to, optical media, magnetic media, computer memory, or the like.

The terms "computer program," "software," "application," "computer-usable program code," variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, although not necessarily directly, and not necessarily mechanically, e.g., communicatively linked through a communication channel or pathway or another component or system. This invention can be embodied in other forms without departing from the spirit or essential attributes thereof. Accordingly, reference should be made to the following claims, rather than to the foregoing specification, as indicating the scope of the invention.

What is claimed is:

1. A computer-implemented method of performing a Computer-Aided Design (CAD) flow on a circuit design for an integrated circuit, the method comprising:
   inserting a preprocessing task into the CAD flow prior to a selected task that does not recognize a constraint, wherein the preprocessing task introduces a modification into the circuit design according to the constraint;
   processing the circuit design comprising the modification through the selected task of the CAD flow;
   inserting a reversal task into the CAD flow subsequent to the selected task, wherein the reversal task removes the modification introduced into the circuit design by the preprocessing task;
   processing the circuit design through at least one other task of the CAD flow; and
   outputting the processed circuit design.

2. The computer-implemented method of claim 1, further comprising defining the constraint to limit the flip-flop elements in a slice of the integrated circuit to include only flip-flop elements having a same signature.

3. The computer-implemented method of claim 2, further comprising defining a signature of a flip-flop element to specify, for a selected flip-flop element, a clock signal that drives the selected flip-flop element and a control mode for the selected flip-flop element.

4. The computer-implemented method of claim 1, wherein the preprocessing task comprises clustering flip-flop elements of the circuit design forming a plurality of clusters of flip-flop elements, wherein each cluster comprises a number of flip-flop elements that does not exceed a number of flip-flops within a slice of the integrated circuit.

5. The computer-implemented method of claim 4, wherein clustering flip-flop elements further comprises including within each cluster only flip-flop elements driven by a same clock signal and having a same control mode.

6. The computer-implemented method of claim 1, further comprising selecting the CAD flow to be a placer CAD flow that assigns elements of the circuit design to locations on the integrated circuit, wherein the circuit design that is output is a placed circuit design.

7. The computer-implemented method of claim 1, further comprising selecting the selected task to be an AP-Spread task.

8. The computer-implemented method of claim 1, further comprising selecting the at least one other task of the CAD flow to be an AP-Fitter task.

9. A computer-implemented method of performing a placer Computer-Aided Design (CAD) flow on a circuit design for an integrated circuit, the method comprising:
   distributing circuit elements of the circuit design to locations throughout the integrated circuit, wherein the circuit elements comprise flip-flop elements;
   inserting a preprocessing task into the placer CAD flow, wherein the preprocessing task comprises:
      determining a signature for each flip-flop element of the circuit design, and
      forming clusters of flip-flop elements having a same signature;
   assigning circuit elements to sites on the integrated circuit, wherein each cluster is processed as an single entity;
   inserting a de-clustering task into the placer CAD flow, wherein the de-clustering task de-clusters the circuit design;
   performing at least one additional task of the placer CAD flow upon the circuit design; and
   outputting a placed circuit design.

10. The computer-implemented method of claim 9, wherein forming clusters further comprises creating a cluster for each flip-flop element, wherein each cluster, at least initially, comprises a single flip-flop element.

11. The computer-implemented method of claim 10, wherein forming clusters further comprises:
   identifying at least one pair of clusters according to merge criteria;
   forming a merged cluster from each pair of clusters; and
   assigning a location on the integrated circuit to each merged cluster.

12. The computer-implemented method of claim 11, wherein forming clusters further comprises, until no further pairs of clusters are identified to be merged, iteratively identifying at least one pair of clusters, forming a merged cluster from each pair of clusters, and selecting a location for each merged cluster.

13. The computer-implemented method of claim 11, wherein the de-clustering task further comprises, for each merged cluster, separating the merged cluster into constituent clusters.

14. The computer-implemented method of claim 13, wherein the de-clustering task further comprises iteratively separating each merged cluster into constituent clusters until no merged clusters remain.

15. A computer program product comprising:
   a computer-usable medium having computer-usable program code that performs a placer Computer-Aided Design (CAD) flow on a circuit design for an integrated circuit, the computer-usable medium comprising:
      computer-usable program code that distributes circuit elements of the circuit design to locations throughout the integrated circuit, wherein the circuit elements comprise flip-flop elements;
      computer-usable program code that inserts a preprocessing task into the placer CAD flow, wherein the preprocessing task comprises:
         computer-usable program code that determines a signature for each flip-flop element of the circuit design, and
         computer-usable program code that forms clusters of flip-flop elements having a same signature;
      computer-usable program code that assigns circuit elements to sites on the integrated circuit, wherein each cluster is processed as a single entity;
      computer-usable program code that inserts a de-clustering task into the placer CAD flow, wherein the de-clustering task comprises computer-usable program code that de-clusters the circuit design;
      computer-usable program code that performs at least one additional task of the placer CAD flow upon the circuit design; and
      computer-usable program code that outputs a placed circuit design.

16. The computer program product of claim 15, wherein the computer-usable program code that forms clusters further comprises computer-usable program code that creates a cluster for each flip-flop element, wherein each cluster, at least initially, comprises a single flip-flop element.

17. The computer program product of claim 16, wherein the computer-usable program code that forms clusters further comprises:
   computer-usable program code that identifies at least one pair of clusters according to merge criteria;
   computer-usable program code that forms a merged cluster from each pair of clusters; and
   computer-usable program code that assigns a location on the integrated circuit to each merged cluster.

18. The computer program product of claim 17, wherein the computer-usable program code that forms clusters further comprises computer-usable program code that, until no further pairs of clusters are identified to be merged, iteratively identifies at least one pair of clusters, forms a merged cluster from each pair of clusters, and selects a location for each merged cluster.

19. The computer program product of claim 17, wherein the computer-usable program code that de-clusters further comprises computer-usable program code that, for each merged cluster, separates the merged cluster into constituent clusters.

20. The computer program product of claim 18, wherein the computer-usable program code that de-clusters further comprises computer-usable program code that iteratively separates each merged cluster into constituent clusters.

* * * * *